(12) United States Patent
Yang et al.

(10) Patent No.: US 9,484,084 B2
(45) Date of Patent: Nov. 1, 2016

(54) PULLING DEVICES FOR DRIVING DATA LINES

(71) Applicant: TAIWAN SEMICONDUCTOR MANUFACTURING COMPANY, LTD., Hsinchu (TW)

(72) Inventors: Hao-I Yang, Hsinchu (TW); Chia-En Huang, Hsinchu (TW); Cheng Hung Lee, Hsinchu (TW); Geng-Cing Lin, Hsinchu (TW); Jung-Ping Yang, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/920,209

(22) Filed: Oct. 22, 2015

(65) Prior Publication Data

US 2016/0240245 A1    Aug. 18, 2016

Related U.S. Application Data

(60) Provisional application No. 62/116,006, filed on Feb. 13, 2015.

(51) Int. Cl.
| | | |
|---|---|---|
| *G11C 7/00* | (2006.01) | |
| *G11C 11/419* | (2006.01) | |
| *G11C 7/10* | (2006.01) | |
| *G11C 8/06* | (2006.01) | |
| *G11C 8/18* | (2006.01) | |
| *G11C 7/18* | (2006.01) | |
| *G11C 7/22* | (2006.01) | |

(52) U.S. Cl.
CPC .............. *G11C 11/419* (2013.01); *G11C 7/10* (2013.01); *G11C 7/18* (2013.01); *G11C 7/22* (2013.01); *G11C 8/06* (2013.01); *G11C 8/18* (2013.01)

(58) Field of Classification Search
CPC .............. G11C 11/419; G11C 11/413; G11C 11/4082; G11C 7/10; G11C 7/18; G11C 7/22; G11C 8/08; G11C 8/18
USPC ......... 365/185.05, 154, 189.01, 189.12, 191, 365/193
See application file for complete search history.

(56) References Cited

U.S. PATENT DOCUMENTS

| | | | |
|---|---|---|---|
| 6,184,488 B1 * | 2/2001 | Gates .................... | H01J 37/321 118/723 I |
| 8,559,251 B2 | 10/2013 | Lin et al. | |
| 8,605,523 B2 * | 12/2013 | Tao ........................ | G11C 29/24 365/149 |
| 8,630,132 B2 | 1/2014 | Cheng et al. | |
| 8,760,948 B2 * | 6/2014 | Tao .......................... | G11C 7/08 365/191 |
| 8,848,467 B1 | 9/2014 | Hua et al. | |
| 2001/0024382 A1 * | 9/2001 | Shimoyama ............. | G11C 7/22 365/189.011 |
| 2003/0067813 A1 * | 4/2003 | Nagamine .............. | G11O 5/063 365/49.11 |

(Continued)

*Primary Examiner* — Gene Auduong
(74) *Attorney, Agent, or Firm* — Hauptman Ham, LLP

(57) ABSTRACT

A circuit includes a first data line, a second data line, a first pulling device, a second pulling device, a third pulling device, and a fourth pulling device. The first pulling device is configured to be activated or deactivated responsive to a first control signal; and is configured to pull a first signal at the first data line toward a voltage level of a first voltage based on a second signal at the second data line when the first pulling device is activated. The second pulling device is configured to be activated or deactivated responsive to a second control signal; and is configured to pull the second signal at the second data line toward the voltage level of the first voltage based on the first signal at the first data line when the second pulling device is activated.

20 Claims, 14 Drawing Sheets

(56) References Cited

U.S. PATENT DOCUMENTS

| | | |
|---|---|---|
| 2014/0032871 A1 | 1/2014 | Hsu et al. |
| 2014/0153321 A1 | 6/2014 | Liaw |
| 2014/0153345 A1 | 6/2014 | Kim et al. |
| 2014/0177352 A1 | 6/2014 | Lum |
| 2014/0233330 A1 | 8/2014 | Ko et al. |
| 2014/0241077 A1 | 8/2014 | Katoch et al. |
| 2014/0269114 A1 | 9/2014 | Yang et al. |

* cited by examiner

PULLING DEVICES FOR DRIVING DATA LINES

BACKGROUND

A Static Random Access Memory (SRAM) is a type of semiconductor memory that uses bi-stable latching circuitry to store data. SRAM is usable to retain data, but remains volatile in the conventional sense that data is eventually lost when the memory is not powered. An SRAM circuit includes a plurality of SRAM memory cells. There are several types of SRAM memory cells, e.g., 6-transistor (6T) SRAM or dual-port 8-transistor (8T) SRAM. Usually, at least two of the transistors in an SRAM memory cell are controlled by a corresponding control line, also known as a "word line," and used as switches to selectively couple the bi-stable latching circuitry of the SRAM memory cell with two data lines, also known as "bit line" and "bit line bar" or "bit line" and "complementary bit line."

While writing data to a memory cell through corresponding data lines, in some circumstances, a dummy read occurs when the corresponding word line has caused the switches of the selected memory cell to be turned on in advance of the to-be-written data are applied to the data lines. As a result, the data previously stored in the selected memory cell are transferred to the corresponding data lines, and the write driver in some occasions needs to overwrite or flip the logic values on the data lines in order to successfully perform the write operation. When an SRAM circuit is designed to operate at a low power supply voltage, the write margin and operable speed of the SRAM memory cell is limited by many factors, including the capability of overwriting the logic values on the data lines imposed by the dummy read during a write operation.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
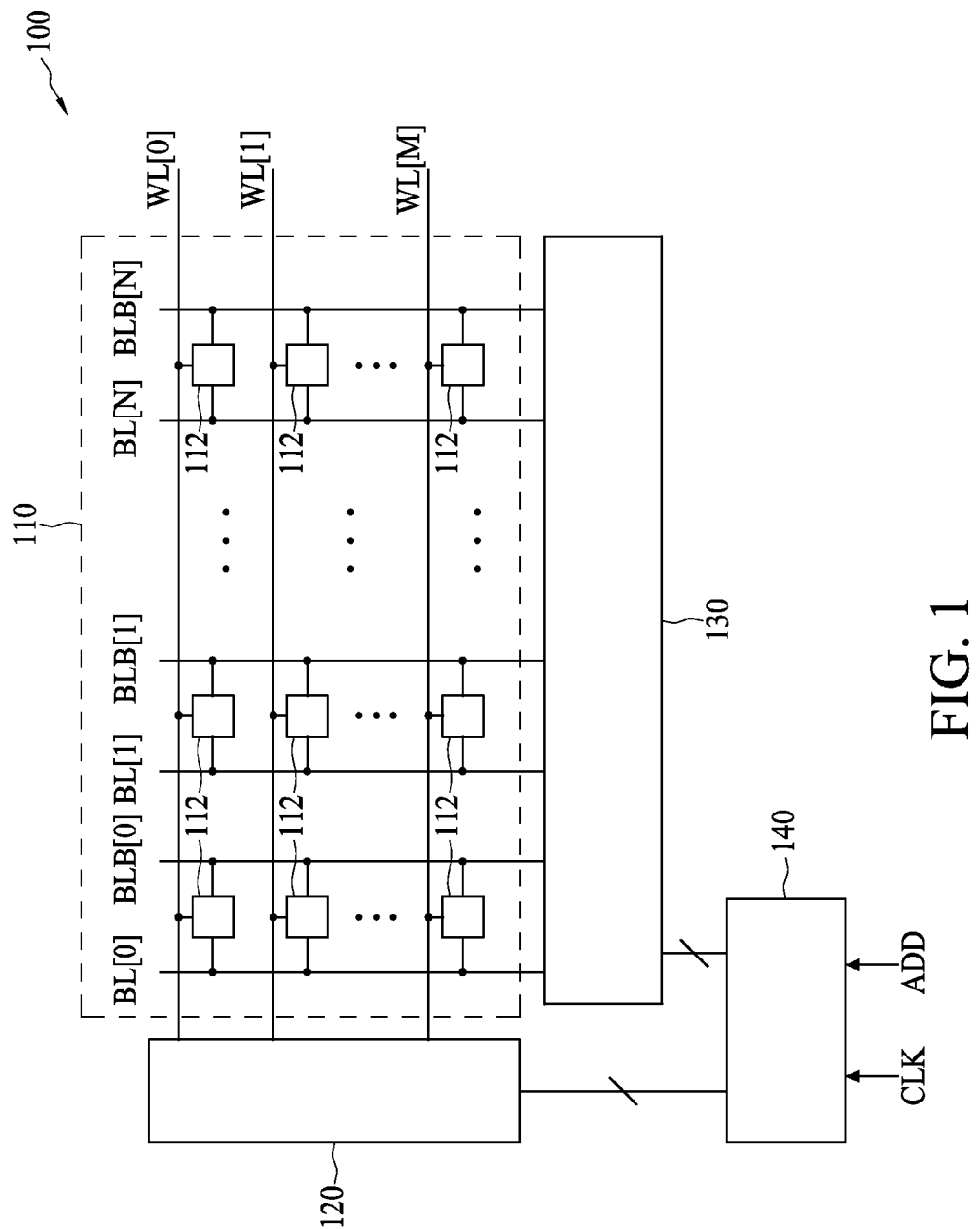
FIG. 1 is a schematic diagram of a memory circuit in accordance with one or more embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments of the present disclosure, two pulling devices of a column driving circuit corresponding to a pair of data lines, specifically a bit line and a complementary bit line, having a cross-coupled configuration. One of the pulling devices is deactivated based on the to-be-written data during a write operation in order to avoid or minimize current fighting when the column driving circuit is applying the logical values to the data lines. In some embodiments, the two pulling devices also function as level shifters between various control signals and the voltage swing of the data lines.

FIG. 1 is a schematic diagram of a memory circuit 100 in accordance with one or more embodiments. Memory circuit 100 has been simplified in furtherance of the understanding of the present disclosure. A person of ordinary skill in the art would appreciate that, in some embodiments, varied or additional electrical components may be implemented in conjunction with memory circuit 100.

Memory circuit 100 is an SRAM circuit including an SRAM memory cell array 110, a row driving circuit 120 coupled with the SRAM memory cell array through a plurality of word lines WL[0:M], and a column driving circuit 130 coupled with the SRAM memory cell array 110 through a plurality of data lines, including bit lines BL[0:N] and corresponding complementary bit lines (also known as bit line bar) BLB[0:N], where "M" and "N" are positive integers. Memory circuit 100 also includes a control circuit 140 coupled with, and configured to control, row driving circuit 120 and column driving circuit 130.

The SRAM memory cell array 110 has a plurality of memory cells 112 usable for storing data. Each memory cell 112 comprises bi-stable latching circuitry acting as a storage unit and two switches coupled with the storage unit. Also, each memory cell 112 is coupled with one of the word lines WL[0:M], one of the bit lines BL[0:N], and the corresponding one of the complementary bit lines BLB[0:N]. When a memory cell 112 is selected to be accessed, a word line signal on a corresponding word line is activated to cause the switches of the memory cell to electrically couple the storage unit with corresponding bit lines. In some embodiments, the control circuit 140 receives an address ADD of a selected memory cell 112 and a clock signal CLK, and generates appropriate signals to access the selected memory cell 112 through the row driving circuit 120 and the column driving circuit 130. For example, the row driving circuit 120 is caused to activate one of the word lines WL[0:M] according to the received address, and the column driving circuit 130 is caused to identify a pair of a bit line and a complementary bit line, said BL[0] and BLB[0] for example, based on the received address and read or write data using the identified pair of bit line BL[0] and complementary bit line BLB[0].

Figure 2:
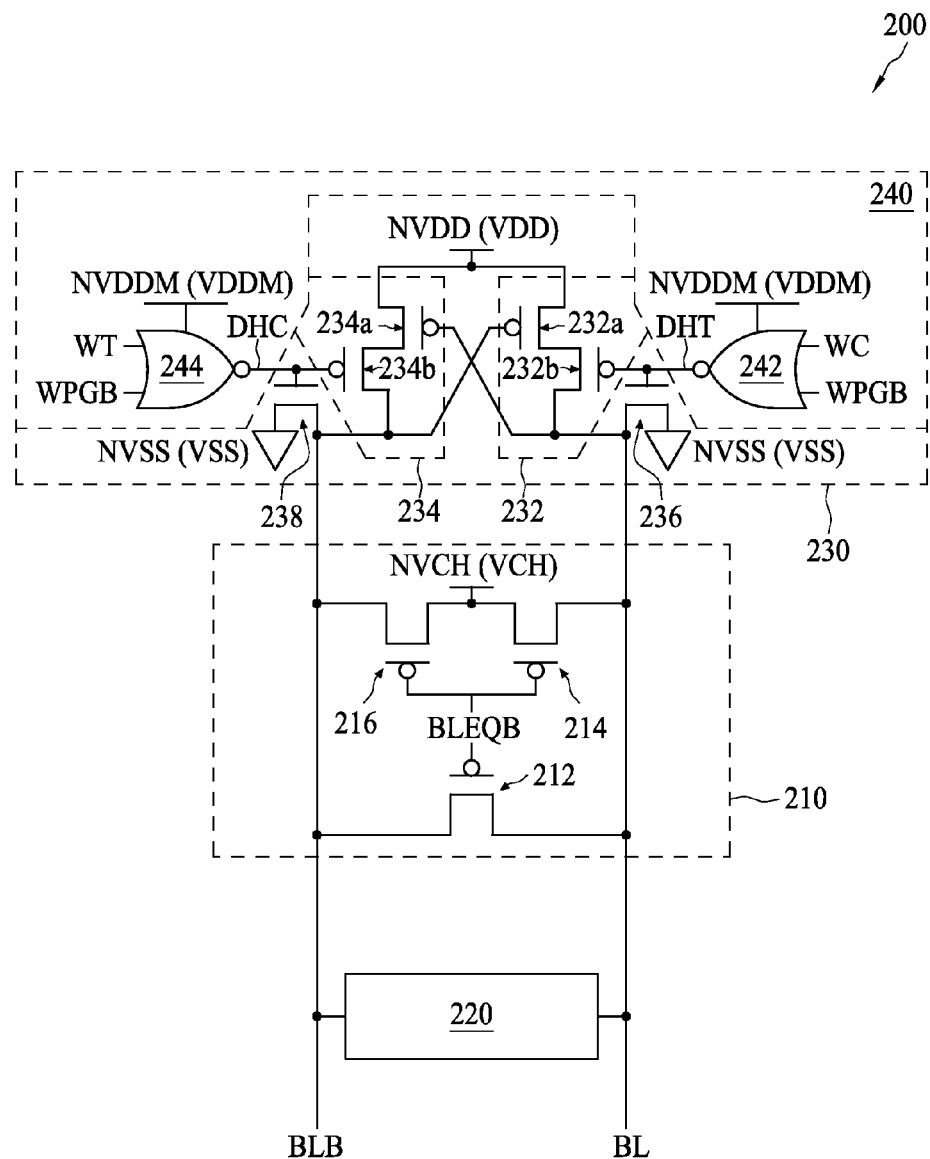
FIG. 2 is a schematic diagram of a portion of an example column driving circuit usable in the memory circuit of FIG. 1 in accordance with one or more embodiments.

FIG. 2 is a schematic diagram of a portion of an example column driving circuit 200 in accordance with one or more embodiments. In some embodiments, column driving circuit 200 is usable as the column driving circuit 130 (FIG. 1).

Column driving circuit 200 includes a bit line BL, a complementary bit line BLB, a pre-charge circuit 210 coupled with bit lines BL and BLB, a sense amplifier 220 coupled with bit lines BL and BLB, and a write driver 230 coupled with bit lines BL and BLB. In some embodiments, bit lines BL and BLB are data lines corresponding to a pair of bit lines BL[0:N] and BLB[0:N] that are coupled with a column of memory cells 112 (FIG. 1).

Pre-charge circuit 210 is configured to charge bit lines BL and BLB to a precharge voltage VCH in response to a precharge control signal BLEQB. Precharge circuit 210 includes P-type transistors 212, 214, and 216. Transistor 212 is coupled between bit lines BL and BLB; transistor 214 is coupled between bit line BL and a node NVCH; and transistor 216 is coupled between bit line BLB and a node NVCH. Gates of transistors 212, 214, and 216 are configured to receive precharge control signal BLEQB. Node NVCH is configured to carry precharge voltage VCH.

Sense amplifier 220 is configured to detect and amplify a voltage difference between bit lines BL and BLB during a read operation. Write driver 230 is configured to set bit lines BL and BLB at different voltage levels during a write operation in response to write data signals WC and WT. In some embodiments, a portion of write driver 230 is configured to work with sense amplifier 220 during a read operation. In some embodiments, sense amplifier 220 operates without the assist of write driver 230 during a read operation. Some details regarding sense amplifier 220 and performing a read operation using sense amplifier 220 are omitted in this disclosure in order to avoid unnecessarily obscuring the illustration of the write deriver 230.

Write driver 230 includes pulling devices 232, 234, 236, and 238 and a control circuit 240. Write driver 230 also includes various voltage nodes NVDD, NVDDM, and NVSS. Node NVDD is configured to carry a supply voltage VDD. Node NVDDM is configured to carry another supply voltage VDDM. Node NVSS is configured to carry a reference voltage VSS. In some embodiments, a voltage level of voltage VDD and a voltage level of voltage VDDM are greater than a voltage level of voltage VSS. In some embodiments, the voltage level of voltage VDD differs from the voltage level of voltage VDDM. In some embodiments, voltage node NVCH is coupled with voltage node NVDD, and the voltage level of voltage VDD and the voltage level of voltage VCH are the same.

Pulling device 232 is coupled between bit line BL and voltage node NVDD. Pulling device 232 is configured to be activated or deactivated responsive to a first control signal DHT. For example, when first control signal DHT is logic high, pulling device 232 is deactivated; when first control signal DHT is logic low, pulling device 232 is activated. Pulling device 232 is also configured to pull a signal at bit line BL toward a voltage level of the supply voltage VDD based on a signal at bit line BLB when pulling device 232 is activated. For example, when pulling device 232 is activated and the signal at bit line BLB is logic low, pulling device 232 pulls the signal toward the voltage level of supply voltage VDD.

Pulling device 232 includes P-type transistors 232a and 232b coupled in series between node NVDD and bit line BL. A source of transistor 232a is coupled with node NVDD. A drain of transistor 232a is coupled with a source of transistor 232b. A drain of transistor 232b is coupled with bit line BL. A gate of transistor 232a is coupled with bit line BLB. A gate of transistor 232b is configured to receive control signal DHT.

Pulling device 234 is coupled between bit line BLB and voltage node NVDD. Pulling device 234 is configured to be activated or deactivated responsive to a second control signal DHC in a manner similar to the operation of pulling device 232 based on control signal DHT. Pulling device 234 is also configured to pull the signal at bit line BLB toward the voltage level of the supply voltage VDD based on the signal at bit line BL when pulling device 234 is activated in a manner similar to the operation of pulling device 232 based on the signal at bit line BLB.

Pulling device 234 includes P-type transistors 234a and 234b coupled in series between node NVDD and bit line BLB. A source of transistor 234a is coupled with node NVDD. A drain of transistor 234a is coupled with a source of transistor 234b. A drain of transistor 234b is coupled with bit line BLB. A gate of transistor 234a is coupled with bit line BL. A gate of transistor 234b is configured to receive control signal DHC.

Pulling device 236 is coupled between bit line BL and voltage node NVSS. Pulling device 236 is configured to pull the signal at bit line BL toward the voltage level of the reference voltage VSS based on the control signal DHT. Pulling device 236 is an N-type transistor. A source of transistor 236 is coupled with node NVSS. A drain of transistor 236 is coupled with bit line BL. A gate of transistor 236 is configured to receive control signal DHT.

Pulling device 238 is coupled between bit line BLB and voltage node NVSS. Pulling device 238 is configured to pull the signal at bit line BLB toward the voltage level of the reference voltage VSS based on the control signal DHC. Pulling device 238 is an N-type transistor. A source of transistor 238 is coupled with node NVSS. A drain of transistor 238 is coupled with bit line BLB. A gate of transistor 238 is configured to receive control signal DHC.

Control circuit 240 is coupled with pulling devices 232, 234, 236, and 238. Control circuit 240 is configured to generate the first control signal DHT based on a complementary write data signal WC and a write control signal WPGB. Control circuit 240 is also configured to generate the second control signal DHC based on a write data signal WT and the write control signal WPGB. In some embodiments, during a write operation, signals WT and WC are logically complementary to each other and correspond to the data to be written to a memory cell through bit lines BL and BLB. In some embodiments, write control signal WPGB is logic low when bit lines BL and BLB are selected for performing a write operation and logic high when bit lines BL and BLB are not selected for performing the write operation.

Control circuit 240 includes NOR gates 242 and 244. NOR gate 242 includes two input terminals configured to receive signals WC and WPGB, respectively. NOR gate 242 also includes an output terminal coupled with the gates of transistors 232*b* and 236 and configured to output signal DHT. NOR gate 244 includes two input terminals configured to receive signals WT and WPGB, respectively. NOR gate 244 also includes an output terminal coupled with the gates of transistors 234*b* and 238 and configured to output signal DHC.

Moreover, NOR gates 242 and 244 are coupled with node NVDDM and configured to output control signals DHC and DHT having a first voltage swing from VDDM to VSS. On the other hand, bit lines BL and BLB are pulled toward VDD or VSS through various pulling devices 232, 234, 236, and 238, and thus have a second voltage swing from VDD to VSS. Therefore, when the voltage level of supply voltage VDD differs from the voltage level of supply voltage VDDM, the first voltage swing also differs from the second voltage swing. In such a circumstance, pulling devices 232, 234, 236, and 238 also function as level shifters to accommodate signals having different voltage swings.

Figure 3A:
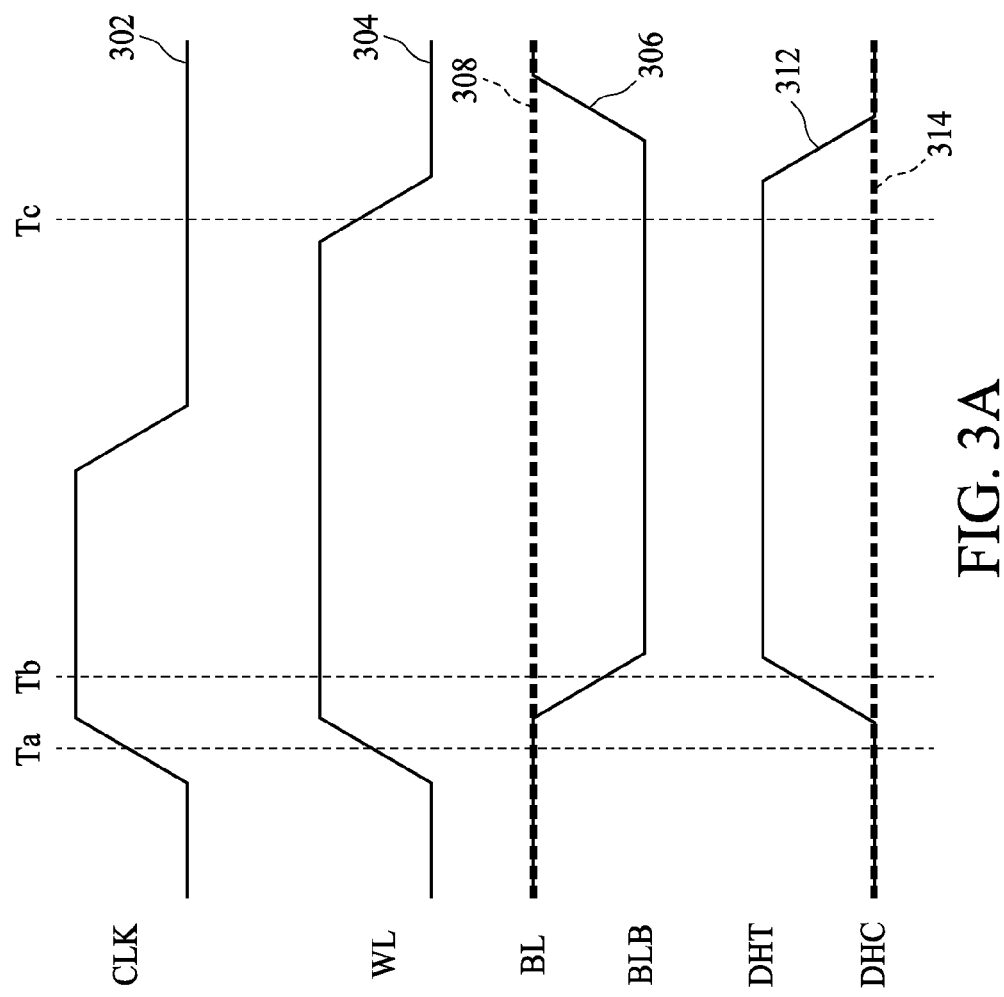
FIG. 3A is a timing diagram of various signals in FIG. 1 and FIG. 2 when performing a write operation without the occurrence of a dummy read in accordance with one or more embodiments.

FIG. 3A is a timing diagram of various signals in FIG. 1 and FIG. 2 when performing a write operation without the occurrence of a dummy read in accordance with one or more embodiments. Waveform 302 corresponds to clock signal CLK. Waveform 304 corresponds to a word line signal WL on a word line of the word line signals WL[0:M]. Waveform 306 corresponds to the signal at bit line BL, and waveform 308 corresponds to the signal at bit line BLB. Waveform 312 corresponds to control signal DHT, and waveform 314 corresponds to control signal DHC.

In FIG. 3A, prior to time Ta, the signals on bit lines BL and BLB are precharged by precharge circuit 210 to voltage VCH, or voltage VDD in the embodiment depicted in FIG. 3A. Write data signals WT and WC are set to a logic high value and/or write control signal WPGB is set to a logic high value. As a result, control signals DHT and DHC are logic low.

At time Ta, in response to a rising edge of clock signal CLK, control circuit 120 causes word line signal WL to transition from logic low to logic high. As a result, the switches of the selected memory cell 112 are turned on to couple the storage unit of the selected memory cell 112 with bit lines BL and BLB. At time Tb, before the storage unit can effectively transfer the previously stored data to bit lines BL and BLB, write data signal WT is set to logic high, write data signal WC is set to logic low, and write control signal WPGB is set to logic low. As a result, control signal DHT is logic high and control signal DHC is logic low. Therefore, control signal DHT turns on transistor 236 to pull the signal on bit line BL to logic low. Control signal DHT also turns off transistor 232*b* or sets transistor 232*b* at a high resistance state to deactivate pulling device 232. Meanwhile, control signal DHC turns off transistor 238 and turns on transistor 234*b* to activate pulling device 234. The signal at bit line BLB is thus pulled and/or kept at logic high through pulling device 234.

At time Tc, control circuit 120 causes word line signal WL to transition from logic high to logic low. In response to the falling edge of word line signal WL, after time Tc, the signals on bit lines BL and BLB are reset to voltage VCH or voltage VDD by precharge circuit 210, and control signals DHT and DHC are reset to logic low.

Figure 3B:
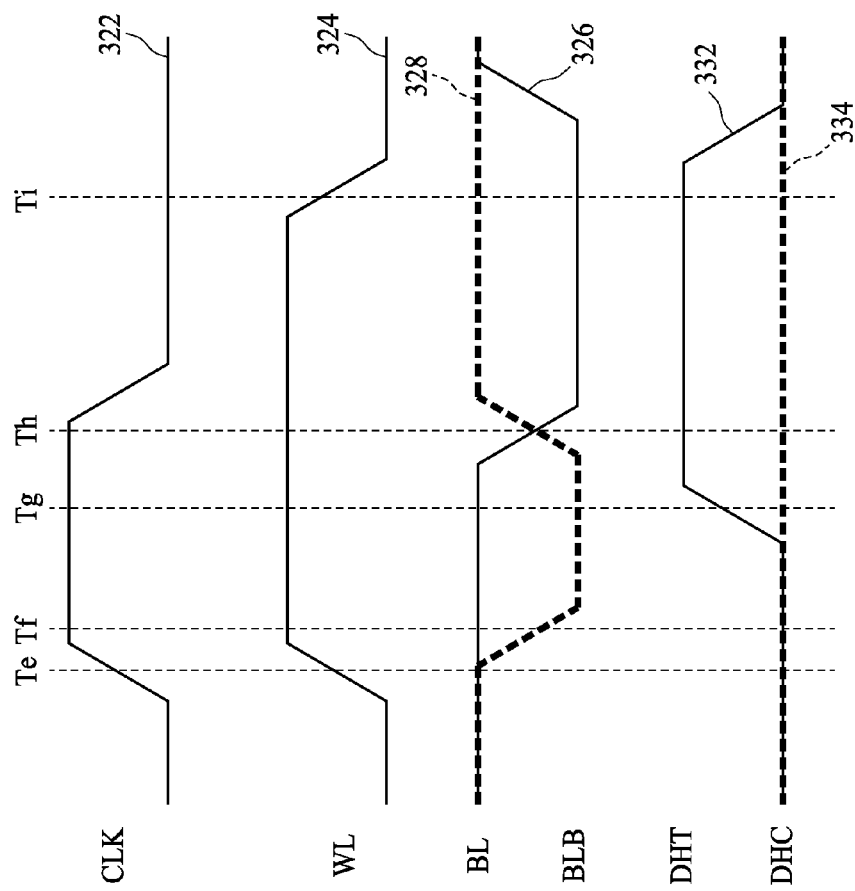
FIG. 3B is a timing diagram of various signals in FIG. 1 and FIG. 2 when performing a write operation with the occurrence of a dummy read in accordance with one or more embodiments.

FIG. 3B is a timing diagram of various signals in FIG. 1 and FIG. 2 when performing a write operation with the occurrence of a dummy read in accordance with one or more embodiments. Waveform 322 corresponds to clock signal CLK.

Waveform 324 corresponds to a word line signal WL on a word line of the word line signals WL[0:M]. Waveform 326 corresponds to the signal at bit line BL, and waveform 328 corresponds to the signal at bit line BLB. Waveform 332 corresponds to control signal DHT, and waveform 334 corresponds to control signal DHC.

In FIG. 3B, prior to time Te, the signals on bit lines BL and BLB are precharged by precharge circuit 210 to voltage VCH or voltage VDD in the embodiment depicted in FIG. 3B. Write data signals WT and WC are set to logic high and/or write control signal WPGB is set to logic high. As a result, control signals DHT and DHC are logic low.

At time Te, in response to a rising edge of clock signal CLK, control circuit 120 causes word line signal WL to transition from logic low to logic high. As a result, the switches of the selected memory cell 112 are turned on to couple the storage unit of the selected memory cell 112 with bit lines BL and BLB. At time Tf, control signals DHT and DHC are not yet changed responsive to write data signals WT and WC and/or write control signal WPGB. The storage unit of the selected memory cell transfers the previously stored data to bit lines BL and BLB, such as setting bit line BL to logic high and setting bit line BLB to logic low in the embodiment depicted in FIG. 3B. A dummy read occurs to bit lines BL and BLB.

At time Tg, write data signal WT is set to logic high, write data signal WC is set to logic low, and write control signal WPGB is set to logic low. As a result, control signal DHT is logic high and control signal DHC is logic low. Therefore, control signal DHT turns on transistor 236 to pull the signal on bit line BL toward logic low. Control signal DHT also turns off transistor 232*b* or sets transistor 232*b* at a high resistance state to deactivate pulling device 232. Meanwhile, control signal DHC turns off transistor 238 and turns on transistor 234*b* to activate pulling device 234. The signal at bit line BLB is thus pulled toward logic high through pulling device 234. At time Th, the pulling devices 232 and 238 were being able to cause the transitioning of logical values of the signals on bit lines BL and BLB. Pulling devices 234 is deactivated by control signal DHC by turning off transistor 234a or causing transistor 234a to form a high resistance path. Pulling devices 234 thus effectively function as an open circuit or a high resistance path between bit line BLB and node NVDD. Pulling device 234 thus avoids or minimizes a current competition against pulling device 238, even though the signal at bit line BL between time Tf and Tg tends to cause transistor 234a of pulling device 234 to have a current fight against pulling device 238.

At time Ti, control circuit 120 causes word line signal WL to transition from logic high to logic low. In response to the falling edge of word line signal WL, after time Tc, the signals on bit lines BL and BLB are reset to voltage VCH or voltage VDD by precharge circuit 210, and control signals DHT and DHC are reset to logic low.

Compared with a column driving circuit that does not deactivate one of pulling devices 232 and 234, by deactivating one of pulling devices 232 and 234 that will cause current fighting against the logical values of the to-be-written data, column driving circuit 200 is capable of overcoming, or flipping, the dummy read at bit lines BL and BLB faster. Also, the configuration depicted in FIG. 2 does not require signal DHC and DHT to have the same voltage swing as the signals on bit lines BL and BLB. Therefore, in some embodiments, when the voltage swing of signal DHC and DHT and the voltage swing of the signals on bit lines BL and BLB are different, pulling devices 232 and 234 also function as level shifters, and additional level shifters are omitted.

Various logical values illustrated in FIGS. 3A and 3B are introduced as examples. In some embodiments, other logical values of various signals consistent with the principles disclosed in this document are contemplated as would normally occur to one of ordinary skill in the pertinent art.

Figure 4:
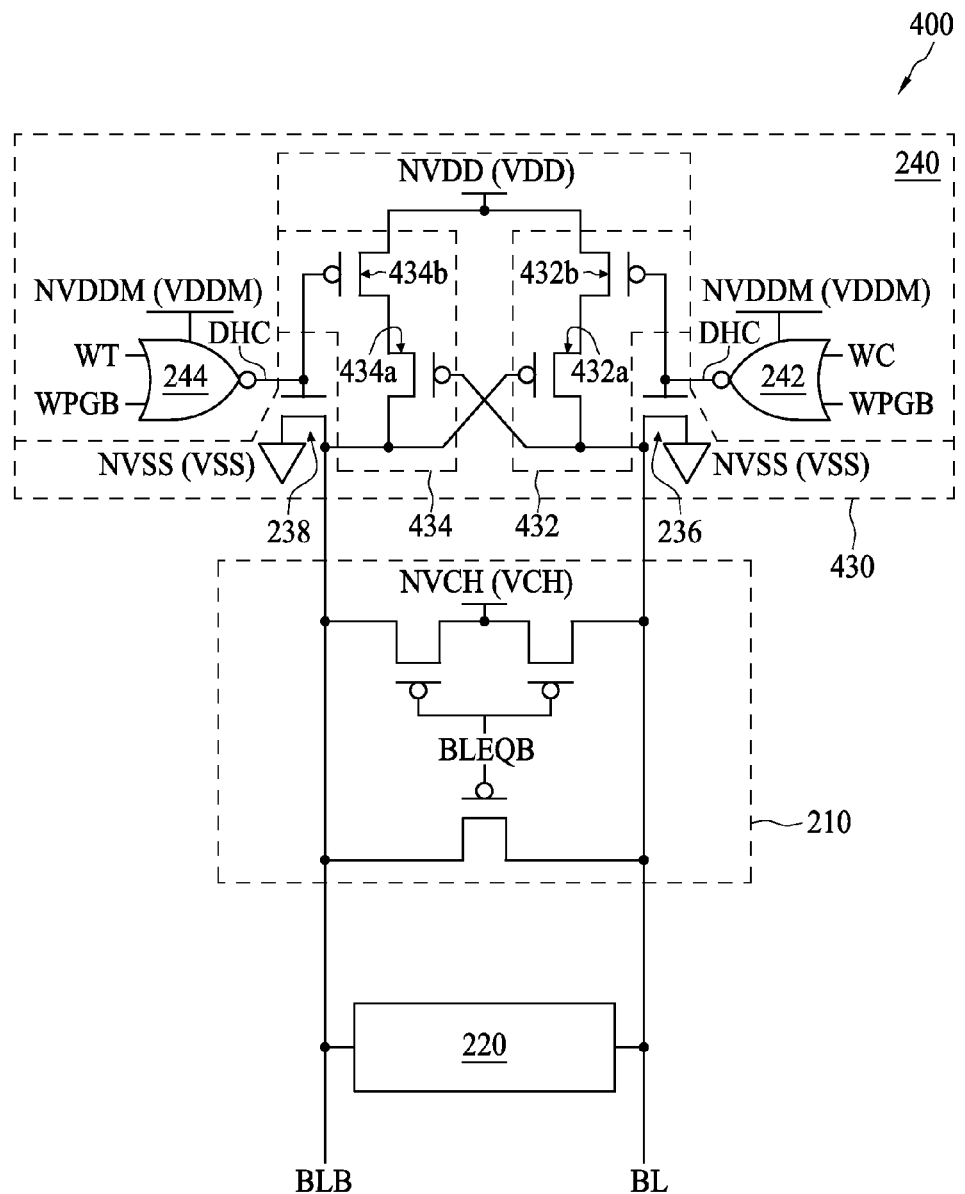
FIG. 4 is a schematic diagram of a portion of another example column driving circuit usable in the memory circuit of FIG. 1 in accordance with one or more embodiments.

FIG. 4 is a schematic diagram of a portion of another example column driving circuit 400 in accordance with one or more embodiments. Components in FIG. 4 that are the same or similar to those in FIG. 2 are given the same reference numbers or labels, and detailed description thereof is thus omitted.

Column driving circuit 400 includes bit lines BL and BLB, a pre-charge circuit 210 coupled with bit lines BL and BLB, a sense amplifier 220 coupled with bit lines BL and BLB, and a write driver 430 coupled with bit lines BL and BLB. In some embodiments, bit lines BL and BLB are data lines corresponding to a pair of bit lines BL[0:N] and BLB[0:N] that are coupled with a column of memory cells 112 in FIG. 1.

Compared with write driver 230 in FIG. 2, write driver 430 replaces pulling devices 232 with pulling device 432 and replaces pulling devices 234 with pulling device 434. Pulling devices 432 and 434 are configured to perform similar functions as those of pulling devices 232 and 234.

Pulling device 432 includes P-type transistors 432a and 432b coupled in series between node NVDD and bit line BL. A source of transistor 432b is coupled with node NVDD. A drain of transistor 432b is coupled with a source of transistor 432a. A drain of transistor 432a is coupled with bit line BL. A gate of transistor 432a is coupled with bit line BLB. A gate of transistor 432b is configured to receive control signal DHT.

Pulling device 434 includes P-type transistors 434a and 434b coupled in series between node NVDD and bit line BLB. A source of transistor 434b is coupled with node NVDD. A drain of transistor 434b is coupled with a source of transistor 434a. A drain of transistor 434a is coupled with bit line BLB. A gate of transistor 434a is coupled with bit line BL. A gate of transistor 434b is configured to receive control signal DHC.

Figure 5:
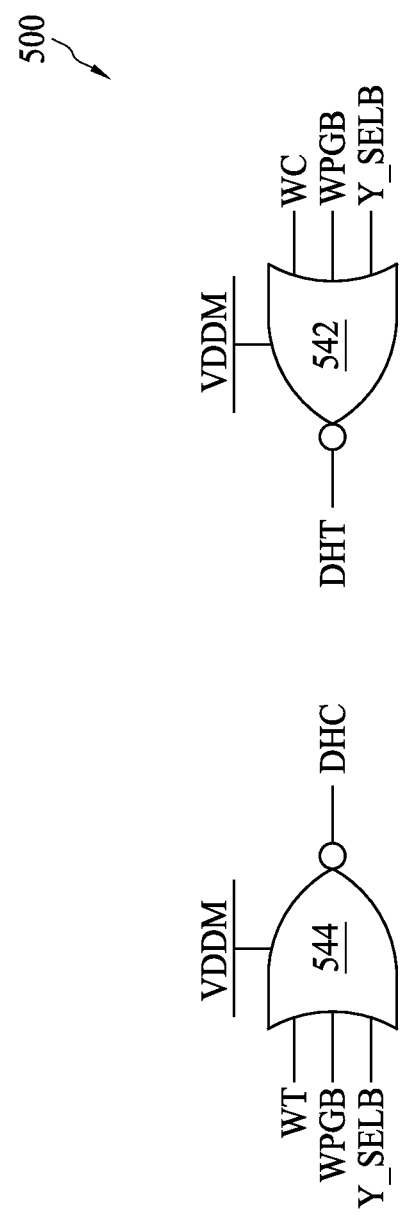
FIG. 5 is a schematic diagram of another example control circuit usable in the column driving circuit of FIG. 2 or FIG. 4 in accordance with one or more embodiments.

FIG. 5 is a schematic diagram of another example control circuit 500 in accordance with one or more embodiments. In some embodiments, control circuit 500 is usable to replace control circuit 240 in FIG. 2 or FIG. 4. Components in FIG. 5 that are the same or similar to those in FIG. 2 or FIG. 4 are given the same reference numbers or labels, and detailed description thereof is thus omitted.

Control circuit 500 is configured to generate the first control signal DHT based on complementary write data signal WC, write control signal WPGB, and a column selection signal Y_SELB. Control circuit 500 is also configured to generate the second control signal DHC based on write data signal WT, write control signal WPGB, and column selection signal Y_SELB. In some embodiments, column selection signal Y_SELB is at a logic low value when bit lines BL and BLB are selected to be accessed and logic high when bit lines BL and BLB are not selected to be accessed.

Control circuit 500 includes NOR gates 542 and 544. NOR gate 542 includes three input terminals configured to receive signals WC, WPGB, and Y_SELB, respectively. NOR gate 542 also includes an output terminal configured to output signal DHT. NOR gate 544 includes three input terminals configured to receive signals WT, WPGB, and Y_SELB, respectively. NOR gate 544 also includes an output terminal configured to output signal DHC. Moreover, NOR gates 542 and 544 are coupled with node NVDDM and configured to output control signals DHC and DHT having a voltage swing from VDDM to VSS.

Figure 6:
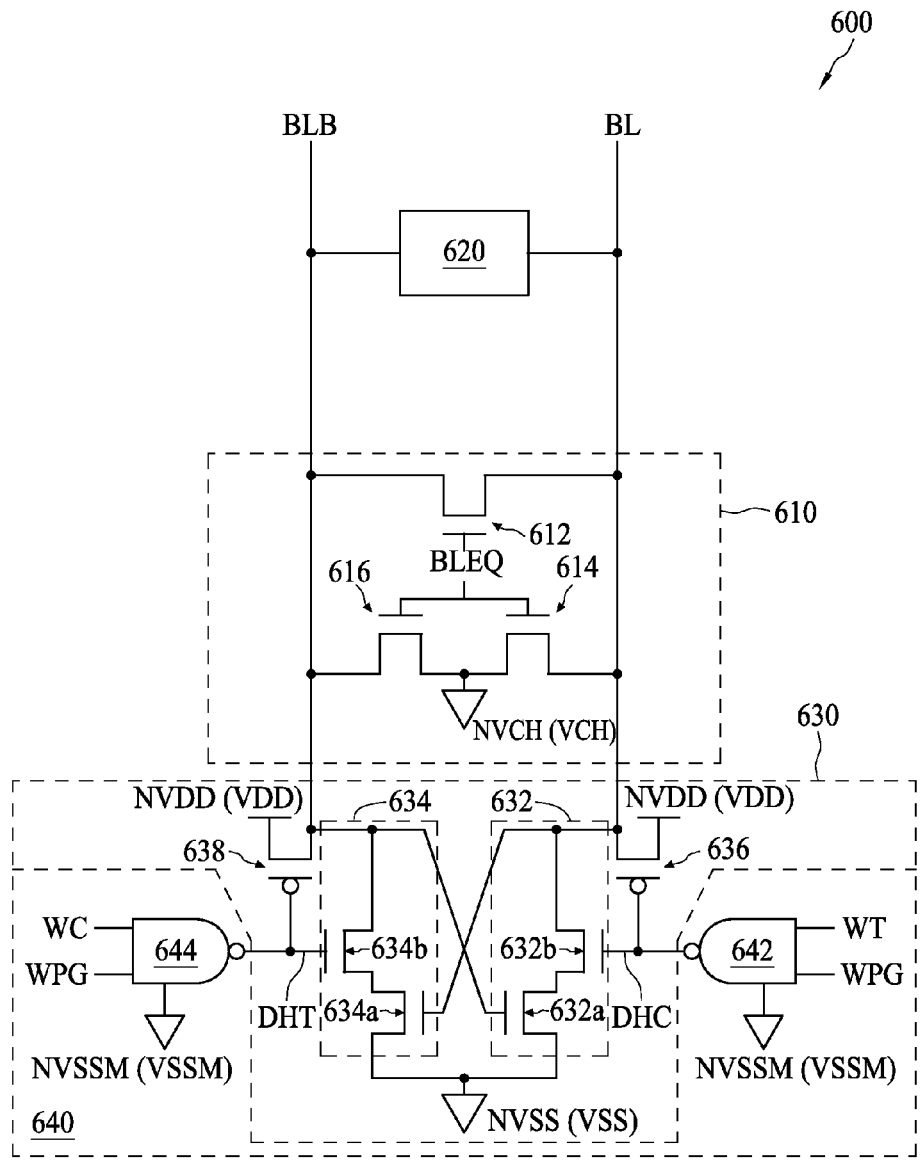
FIG. 6 is a schematic diagram of a portion of another example column driving circuit usable in the memory circuit of FIG. 1 in accordance with one or more embodiments.

FIG. 6 is a schematic diagram of a portion of another example column driving circuit 600 in accordance with one or more embodiments. In some embodiments, column driving circuit 600 is usable column driving circuit 130 in FIG. 1. Components in FIG. 6 that are the same or similar to those in FIG. 2 are given the same reference numbers or labels.

Column driving circuit 600 includes a bit line BL, a complementary bit line BLB, a pre-charge circuit 610 coupled with bit lines BL and BLB, a sense amplifier 620 coupled with bit lines BL and BLB, and a write driver 630 coupled with bit lines BL and BLB. In some embodiments, bit lines BL and BLB are data lines corresponding to a pair of bit lines BL[0:N] and BLB[0:N] that are coupled with a column of memory cells 112 in FIG. 1.

Pre-charge circuit 610 is configured to charge bit lines BL and BLB to a precharge voltage VCH in response to a precharge control signal BLEQ. Precharge circuit 610 includes Ntype transistors 612, 614, and 616. Transistor 612 is coupled between bit lines BL and BLB; transistor 614 is coupled between bit line BL and a node NVCH; and transistor 616 is coupled between bit line BLB and a node NVCH. Gates of transistors 612, 614, and 616 are configured to receive precharge control signal BLEQ. Node NVCH is configured to carry precharge voltage VCH.

Sense amplifier 620 is configured to detect and amplify a voltage difference between bit lines BL and BLB during a read operation. Write driver 630 is configured to set bit lines BL and BLB at different voltage levels during a write operation in response to write data signals WC and WT. In some embodiments, a portion of write driver 630 is configured to work with sense amplifier 620 during a read operation. In some embodiments, sense amplifier 620 operates without the assistance of write driver 630 during a read operation.

Write driver 630 includes pulling devices 632, 634, 636, and 638 and a control circuit 640. Write driver 630 also includes various voltage nodes NVDD, NVSS, and NVSSM. Node NVDD is configured to carry a supply voltage VDD. Node NVSS is configured to carry a reference voltage VSS. Node NVSSM is configured to carry another reference voltage VSSM. In some embodiments, a voltage level of voltage VDD is greater than a voltage level of voltage VSS and a voltage level of voltage VSSM. In some embodiments, the voltage level of voltage VSS and the voltage level of voltage VSSM are different. In some embodiments, voltage node NVCH is coupled with voltage node NVSS, and the voltage level of voltage VSS and the voltage level of voltage VCH are the same.

Pulling device 632 is coupled between bit line BL and voltage node NVSS. Pulling device 632 is configured to be activated or deactivated responsive to a control signal DHC. For example, when control signal DHC is logic low, pulling device 632 is deactivated; when control signal DHC is logic high, pulling device 632 is activated. Pulling device 632 is also configured to pull a signal at bit line BL toward a voltage level of the reference voltage VSS based on a signal at bit line BLB when pulling device 632 is activated. For example, when pulling device 632 is activated and the signal at bit line BLB is logic high, pulling device 632 pulls the signal toward the voltage level of reference voltage VSS.

Pulling device 532 includes N-type transistors 632a and 632b coupled in series between node NVSS and bit line BL. A source of transistor 632a is coupled with node NVSS. A drain of transistor 632a is coupled with a source of transistor 632b. A drain of transistor 632b is coupled with bit line BL. A gate of transistor 632a is coupled with bit line BLB. A gate of transistor 632b is configured to receive control signal DHC.

Pulling device 634 is coupled between bit line BLB and voltage node NVSS. Pulling device 634 is configured to be activated or deactivated responsive to a control signal DHT in a manner similar to the operation of pulling device 632 based on control signal DHC. Pulling device 634 is also configured to pull the signal at bit line BLB toward the voltage level of the reference voltage VSS based on the signal at bit line BL when pulling device 634 is activated in a manner similar to the operation of pulling device 632 based on the signal at bit line BLB.

Pulling device 634 includes N-type transistors 634a and 634b coupled in series between node NVSS and bit line BLB. A source of transistor 634a is coupled with node NVSS. A drain of transistor 634a is coupled with a source of transistor 634b. A drain of transistor 634b is coupled with bit line BLB. A gate of transistor 634a is coupled with bit line BL. A gate of transistor 634b is configured to receive control signal DHT.

Pulling device 636 is coupled between bit line BL and voltage node NVDD. Pulling device 636 is configured to pull the signal at bit line BL toward the voltage level of the supply voltage VDD based on the control signal DHC. Pulling device 636 is a P-type transistor. A source of transistor 636 is coupled with node NVDD. A drain of transistor 636 is coupled with bit line BL. A gate of transistor 636 is configured to receive control signal DHC.

Pulling device 638 is coupled between bit line BLB and voltage node NVDD. Pulling device 638 is configured to pull the signal at bit line BLB toward the voltage level of the supply voltage VDD based on the control signal DHT. Pulling device 638 is a P-type transistor. A source of transistor 638 is coupled with node NVDD. A drain of transistor 638 is coupled with bit line BLB. A gate of transistor 638 is configured to receive control signal DHT.

Control circuit 640 is coupled with pulling devices 632, 634, 636, and 638. Control circuit 640 is configured to generate control signal DHT based on a complementary write data signal WC and a write control signal WPG. Control circuit 640 is also configured to generate control signal DHC based on a write data signal WT and the write control signal WPG. In some embodiments, write control signal WPG is logic high when bit lines BL and BLB are selected for performing a write operation and logic low when bit lines BL and BLB are not selected for performing the write operation.

Control circuit 640 includes NAND gates 642 and 644. NAND gate 642 includes two input terminals configured to receive signals WT and WPG, respectively. NAND gate 642 also includes an output terminal coupled with the gates of transistors 632b and 636 and configured to output signal DHC. NAND gate 644 includes two input terminals configured to receive signals WC and WPG, respectively. NAND gate 644 also includes an output terminal coupled with the gates of transistors 634b and 638 and configured to output signal DHT.

Moreover, NAND gates 642 and 644 are coupled with node NVSSM and configured to output control signals DHC and DHT having a third voltage swing from VDD to VSSM. On the other hand, bit lines BL and BLB are pulled toward VDD or VSS through various pulling devices 632, 634, 636, and 638, and thus have a fourth voltage swing from VDD to VSSM. Therefore, when the voltage level of reference voltages VSS differs from the voltage level of reference voltage VSSM, the third voltage swing also differs from the fourth voltage swing. In such a circumstance, pulling devices 632, 634, 636, and 638 also function as level shifters to accommodate signals having different voltage swings.

In some embodiments, column driving circuit 600 is a logically complementary variation of column driving circuit 200. The operation of column driving circuit 600 is similar to the operation of column driving circuit 200 except the inversion of logic values of various signals. Therefore, the detailed operation of column driving circuit 600 is omitted.

Figure 7:
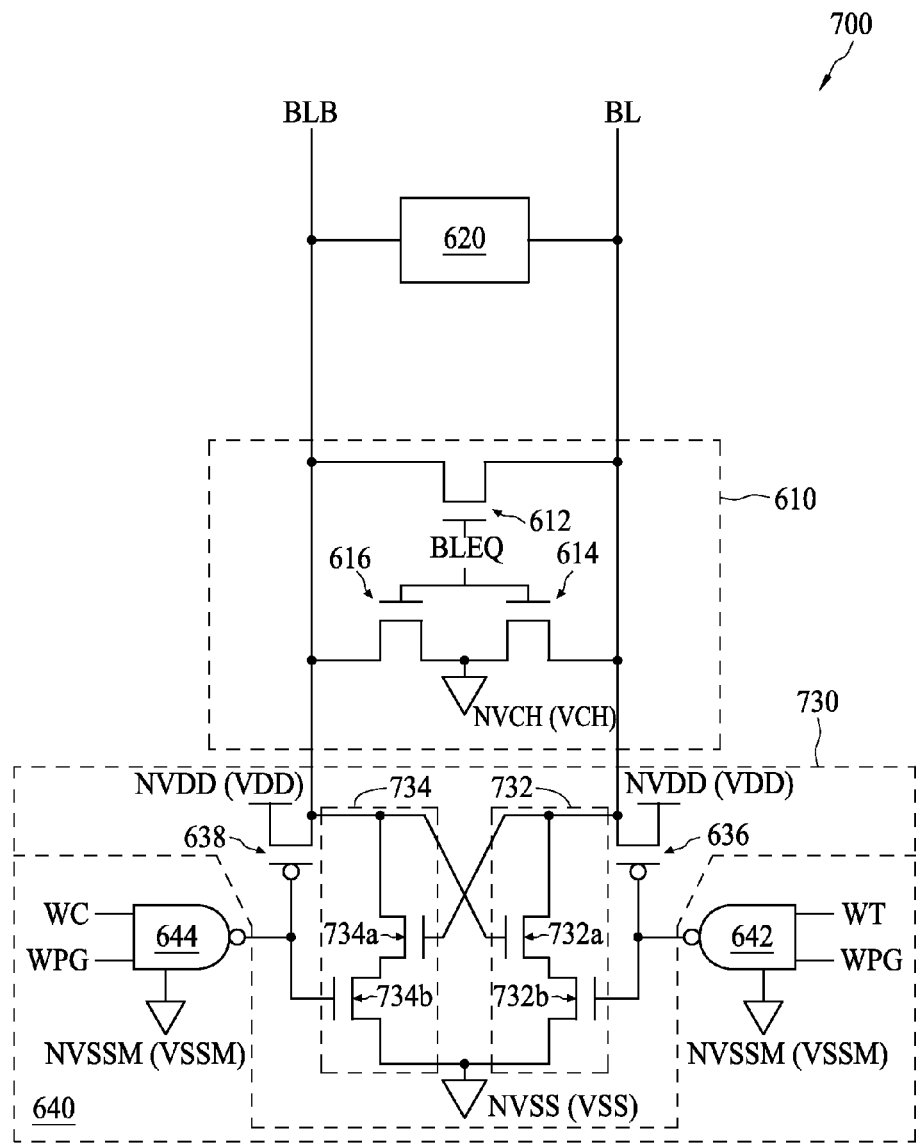
FIG. 7 is a schematic diagram of a portion of another example column driving circuit usable in the memory circuit of FIG. 1 in accordance with one or more embodiments.

FIG. 7 is a schematic diagram of a portion of another example column driving circuit 700 in accordance with one or more embodiments. Components in FIG. 7 that are the same or similar to those in FIG. 6 are given the same reference numbers or labels, and detailed description thereof is thus omitted.

Column driving circuit 700 includes bit lines BL and BLB, a pre-charge circuit 610 coupled with bit lines BL and BLB, a sense amplifier 620 coupled with bit lines BL and BLB, and a write driver 730 coupled with bit lines BL and BLB. In some embodiments, bit lines BL and BLB are data lines corresponding to a pair of bit lines BL[0:N] and BLB[0:N] that are coupled with a column of memory cells 112 in FIG. 1.

Compared with write driver 630 in FIG. 6, write driver 730 replaces pulling devices 632 with pulling device 732 and replaces pulling devices 634 with pulling device 734. Pulling devices 732 and 734 are configured to perform similar functions as those of pulling devices 632 and 634.

Pulling device 732 includes N-type transistors 732a and 732b coupled in series between node NVSS and bit line BL. A source of transistor 732b is coupled with node NVSS. A drain of transistor 732b is coupled with a source of transistor 732a. A drain of transistor 732a is coupled with bit line BL.

A gate of transistor 732a is coupled with bit line BLB. A gate of transistor 732b is configured to receive control signal DHC.

Pulling device 734 includes N-type transistors 734a and 734b coupled in series between node NVSS and bit line BLB. A source of transistor 734b is coupled with node NVSS. A drain of transistor 734b is coupled with a source of transistor 734a. A drain of transistor 734a is coupled with bit line BLB. A gate of transistor 734a is coupled with bit line BL. A gate of transistor 734b is configured to receive control signal DHT.

Figure 8:
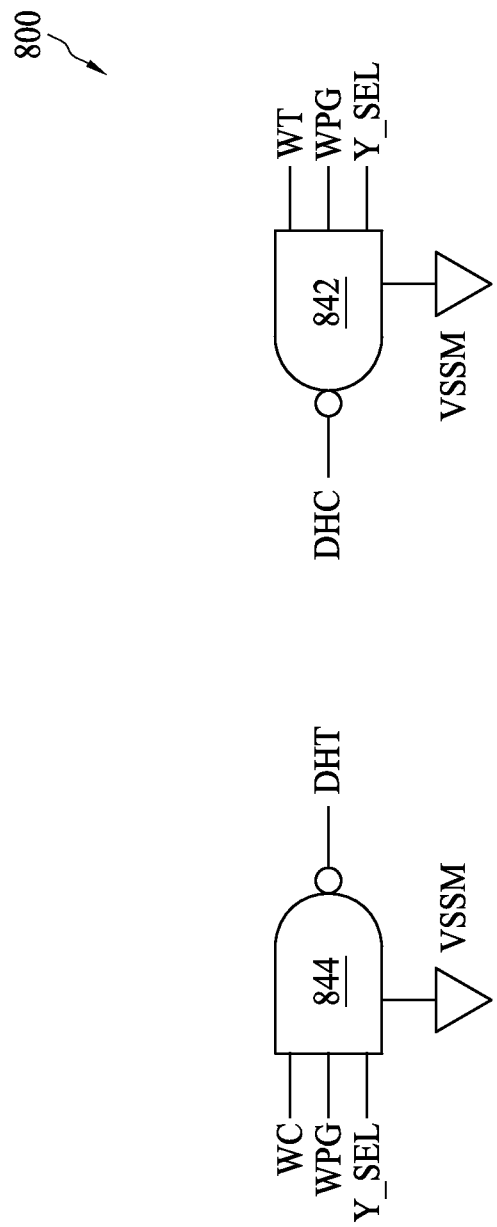
FIG. 8 is a schematic diagram of another example control circuit usable in the column driving circuit of FIG. 6 or FIG. 7 in accordance with one or more embodiments.

FIG. 8 is a schematic diagram of another example control circuit 800 in accordance with one or more embodiments. In some embodiments, control circuit 800 is usable to replace control circuit 640 in FIG. 6 or FIG. 7. Components in FIG. 8 that are the same or similar to those in FIG. 6 or FIG. 7 are given the same reference numbers or labels, and detailed description thereof is thus omitted.

Control circuit 800 is configured to generate control signal DHT based on complementary write data signal WC, write control signal WPG, and a column selection signal Y_SEL. Control circuit 800 is also configured to generate control signal DHC based on write data signal WT, write control signal WPG, and column selection signal Y_SEL. In some embodiments, column selection signal Y_SEL is logic high when bit lines BL and BLB are selected to be accessed and logic low when bit lines BL and BLB are not selected to be accessed.

Control circuit 800 includes NAND gates 842 and 844. NAND gate 842 includes three input terminals configured to receive signals WT, WPG, and Y_SEL, respectively. NAND gate 842 also includes an output terminal configured to output signal DHC. NAND gate 844 includes three input terminals configured to receive signals WC, WPG, and Y_SEL, respectively. NAND gate 844 also includes an output terminal configured to output signal DHT. Moreover, NAND gates 842 and 844 are coupled with node NVSSM and configured to output control signals DHC and DHT having a voltage swing from VDD to VSSM.

Figure 9:
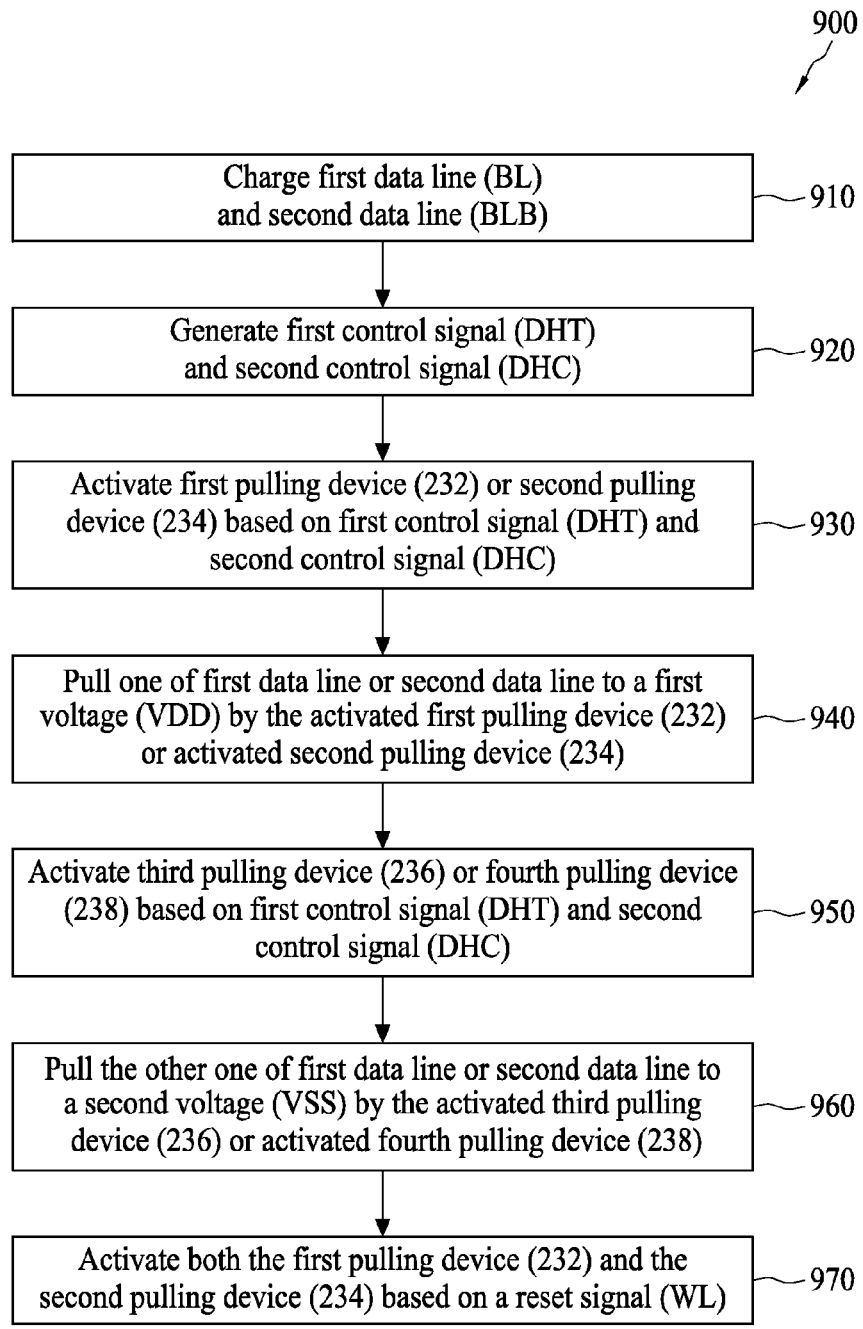
FIG. 9 is a flow chart of a method of operating a column driving circuit in accordance with some embodiments.

FIG. 9 is a flow chart of a method 900 of operating a column driving circuit in accordance with some embodiments. In the present disclosure, method 900 is illustrated based on method column driving circuit 200. It is understood that additional operations may be performed before, during, and/or after the method 900 depicted in FIG. 9, and that some other processes may only be briefly described herein. In some embodiments, method 900 corresponds to operating column driving circuit 200, 400, 600, or 700 as illustrated in conjunction with FIGS. 1-8.

The process begins with operation 910, where a first data line, such as bit line BL, and a second data line, such as complementary bit line BLB, are charged to a precharge voltage VCH by a precharge circuit 210.

The process proceeds to operation 920, where a first control signal DHT and a second control signal DHC are generated by a control circuit responsive to a first write data signal WT, a second write data signal WC, and one or more of a write control signal WPGB or a column selection signal Y_SELB.

The process proceeds to operation 930, where a pulling device of a first pulling device 232 or a second pulling device 234 is activated and the other pulling device of the first pulling device 232 or the second pulling device 234 is deactivated based on control signals DHT and DHC.

The process proceeds to operation 940, where the signal at the corresponding data line of data line BL or BLB that is associated with the activated pulling device 232 or 234 is pulled to voltage VDD by the activated pulling device 232 or 234 based on control signals DHT and DHC.

The process proceeds to operation 940, where a pulling device of a third pulling device 236 or a fourth pulling device 238 is activated and the other pulling device of the third pulling device 236 or the fourth pulling device 238 is deactivated based on control signals DHT and DHC.

The process proceeds to operation 960, where the signal at the other data line of data line BL or BLB that is associated with the activated pulling device 236 or 238 is pulled to voltage VSS by the activated pulling device 236 or 238 based on control signals DHT and DHC.

The process proceeds to operation 970, where control signals DHT and DHC are set to logic low in responsive to a falling edge of a reset signal, such as word line signal WL. Thus, responsive to reset signal WL, the first pulling device 232 and the second pulling device 234 are both activated. In some embodiments, operation 970 is omitted.

Figure 10A:
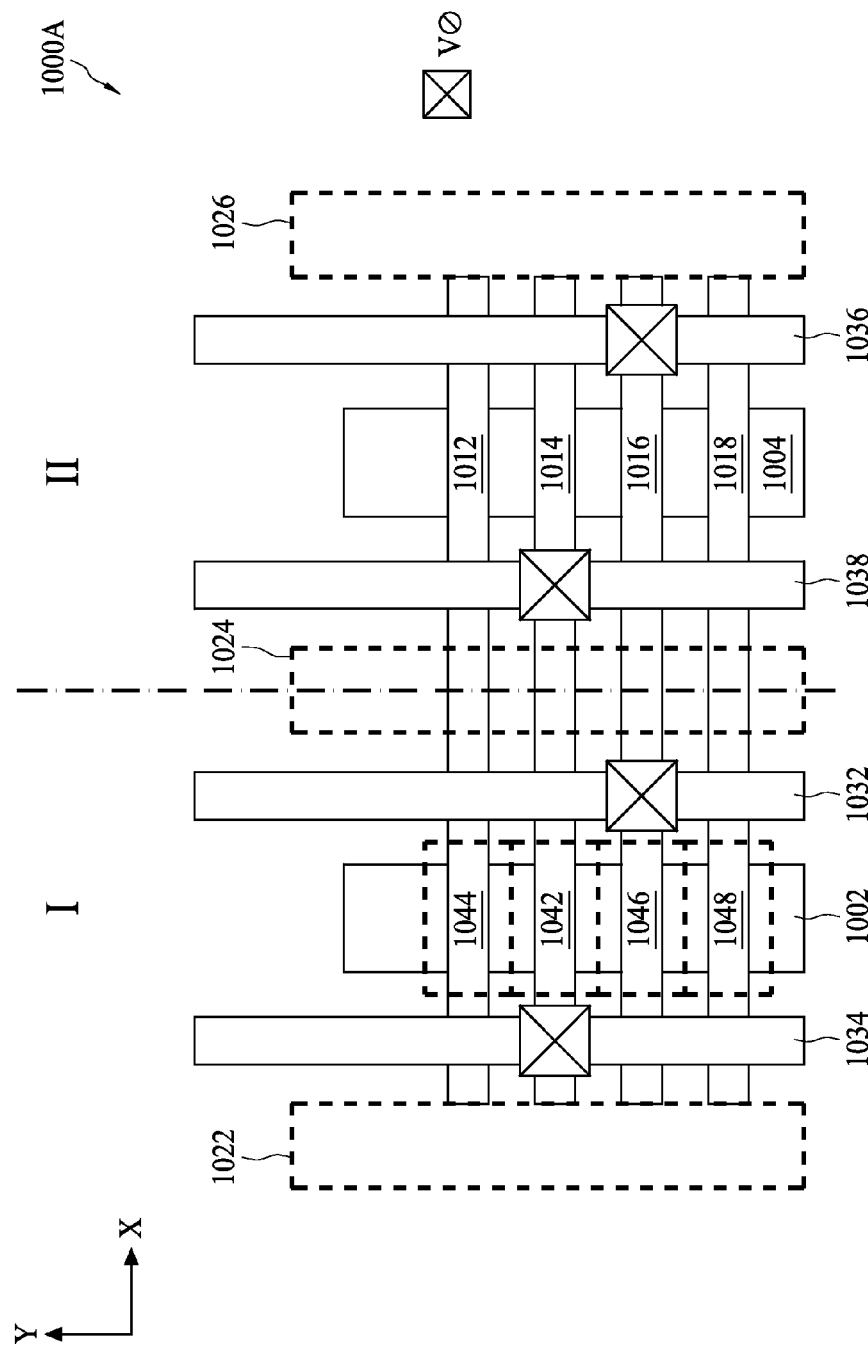
FIG. 10A is a layout diagram of a portion of an example layout design of a column driving circuit implemented based on the column driving circuit of FIG. 2 in accordance with some embodiments.

FIG. 10A is a layout diagram of a portion of an example layout design 1000A of a column driving circuit implemented based on the circuit in FIG. 2 in accordance with some embodiments.

Layout design 1000A includes various layout patterns distributed in two regions I and II. Region I and region II each correspond to placing an individual column of memory cells. Layout design 1000A includes active region layout patterns 1002 and 1004 extending along a column direction Y, a plurality of polysilicon layout patterns 1012, 1014, 1016, and 1018 extending along a row direction X, a plurality of polysilicon cut layout patterns 1022, 1024, and 1026 extending along direction Y, a plurality of conductive layout patterns 1032, 1034, 1036, and 1038 extending along direction Y, and a plurality of via plug layout patterns V0.

Active region layout patterns 1002 and 1004 are usable to form active regions in a resulting memory circuit. Polysilicon layout patterns 1012, 1014, 1016, and 1018 are usable to form polysilicon strips in the resulting memory circuit, which are going to be partially trimmed based on polysilicon cut layout patterns 1022, 1024, and 1026. Conductive layout patterns 1032, 1034, 1036, and 1038 are usable to form data lines, such as bit lines and complementary bit lines, in the resulting memory circuit. Via plug layout patterns V0 are usable to form via plugs connecting various data lines with corresponding polysilicon strips.

Active region layout pattern 1002, a portion of polysilicon layout patterns 1012, 1014, 1016, and 1018, and a portion of conductive layout patterns 1032 and 1034 are in region I and suitable to form pulling devices corresponding to pulling devices 232 and 234 in FIG. 2 for a column of memory cells. Active region layout pattern 1004, a portion of polysilicon layout patterns 1012, 1014, 1016, and 1018, and a portion of conductive layout patterns 1036 and 1038 are in region II and suitable to form pulling devices corresponding to pulling devices 232 and 234 in FIG. 2 for another column of memory cells. Other layout patterns of layout design 1000A are not shown in FIG. 10A in order to avoid unnecessarily obscuring the illustrations of layout design 1000A.

For example, in region I of FIG. 10A, polysilicon layout pattern 1014 and active region layout pattern 1002 correspond to transistor 1042, which corresponds to transistor 232a in FIG. 2. Polysilicon layout pattern 1012 and active region layout pattern 1002 correspond to transistor 1044, which corresponds to transistor 232b.

Polysilicon layout pattern 1016 and active region layout pattern 1002 correspond to transistor 1046, which corresponds to transistor 234a. Polysilicon layout pattern 1018 and active region layout pattern 1002 correspond to transistor 1048, which corresponds to transistor 234b. In some embodiments, each transistor of transistors 1042, 1044, 1046, and 1048 and an individual transistor of the memory cells in the resulting memory circuit have the same size.

In region II of FIG. 10A, various layout patterns are arranged in a manner similar to those in region I, and detailed description thereof is omitted.

Figure 10B:
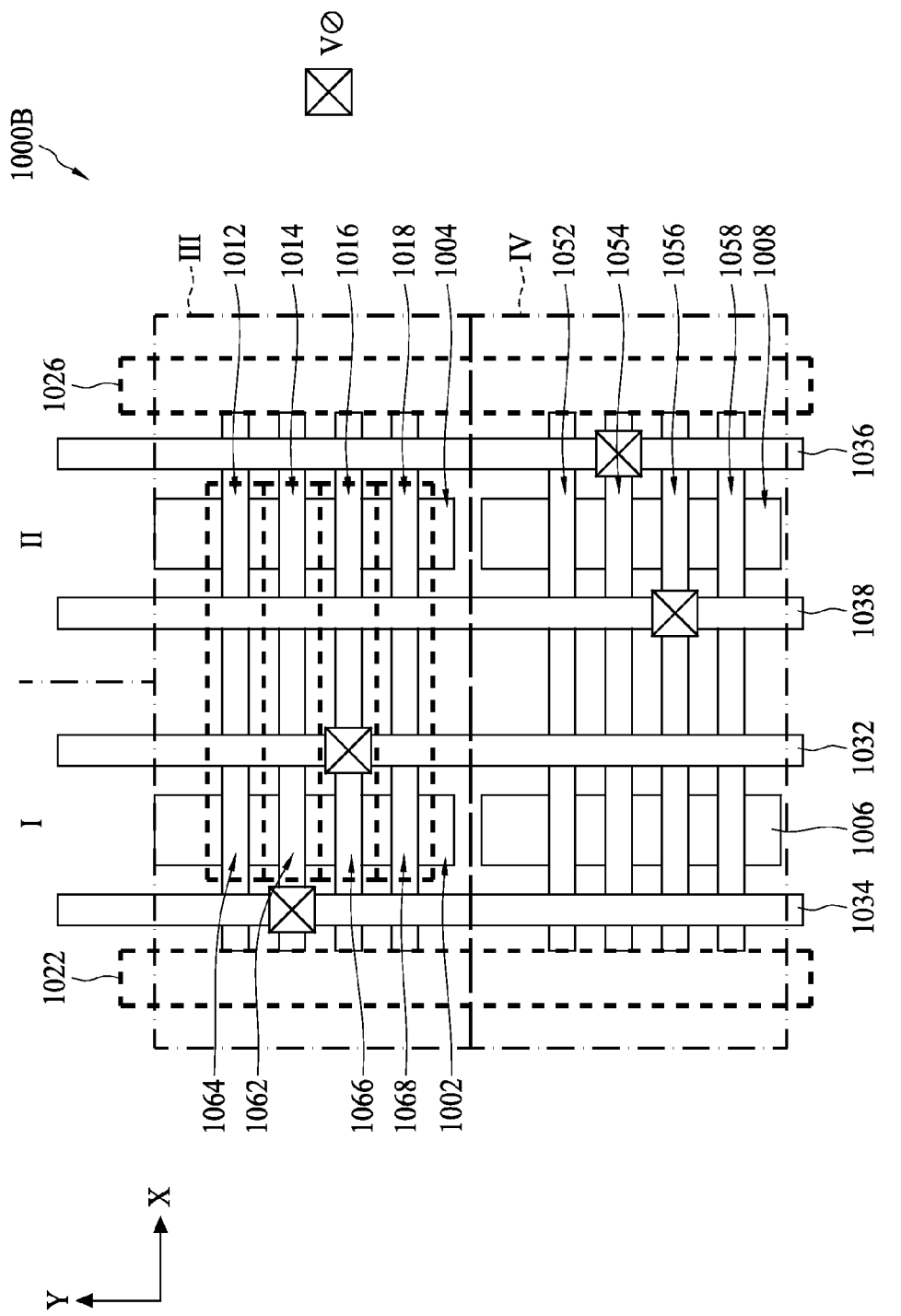
FIG. 10B is a layout diagram of a portion of another example layout design of a column driving circuit implemented based on the column driving circuit of FIG. 2 in accordance with some embodiments.

FIG. 10B is a layout diagram of a portion of another example layout design 1000B of a column driving circuit implemented based on the circuit in FIG. 2 in accordance with some embodiments. Components in FIG. 10B that are the same or similar to those in FIG. 10A are being given the same or similar reference numbers or labels, and detailed description thereof is thus omitted.

Compared with layout design 1000A, layout design 1000B further includes active region layout patterns 1006 and 1008 and polysilicon layout patterns 1052, 1054, 1056, and 1058. Also, polysilicon cut layout pattern 1024 is omitted in layout design 1000B. Layout design 1000B includes various layout patterns distributed in regions I, II, III, and IV. Region I and region II each correspond to placing an individual column of memory cells. Region III corresponds to forming pulling devices 232 and 234 for a column associated with region I, and region IV corresponds to forming pulling devices 232 and 234 for a column associated with region II.

Active region layout patterns 1002 and 1004, a portion of polysilicon layout patterns 1012, 1014, 1016, and 1018, and a portion of conductive layout patterns 1032 and 1034 are in region III and suitable to form pulling devices corresponding to pulling devices 232 and 234 for a column of memory cells. Active region layout patterns 1006 and 1008, a portion of polysilicon layout patterns 1052, 1054, 1056, and 1058, and a portion of conductive layout patterns 1036 and 1038 are in region IV and suitable to form pulling devices corresponding to pulling devices 232 and 234 for another column of memory cells. Other layout patterns of layout design 1000B are not shown in FIG. 10B in order to avoid unnecessarily obscuring the illustrations of layout design 1000B.

For example, in region III of FIG. 10B, polysilicon layout pattern 1014 and active region layout patterns 1002 and 1004 correspond to transistor 1062, which corresponds to transistor 232a in FIG. 2. Polysilicon layout pattern 1012 and active region layout patterns 1002 and 1004 correspond to transistor 1064, which corresponds to transistor 232b. Polysilicon layout pattern 1018 and active region layout patterns 1002 and 1004 correspond to transistor 1066, which corresponds to transistor 234a. Polysilicon layout pattern 1016 and active region layout patterns 1002 and 1004 correspond to transistor 1068, which corresponds to transistor 234b. In some embodiments, each transistor of transistors 1062, 1064, 1066, and 1068 has an effective size twice that of an individual transistor of the memory cells in the resulting memory circuit.

In region IV of FIG. 10B, various layout patterns are arranged in a manner similar to those in region III, and detailed description thereof is omitted.

Figure 11A:
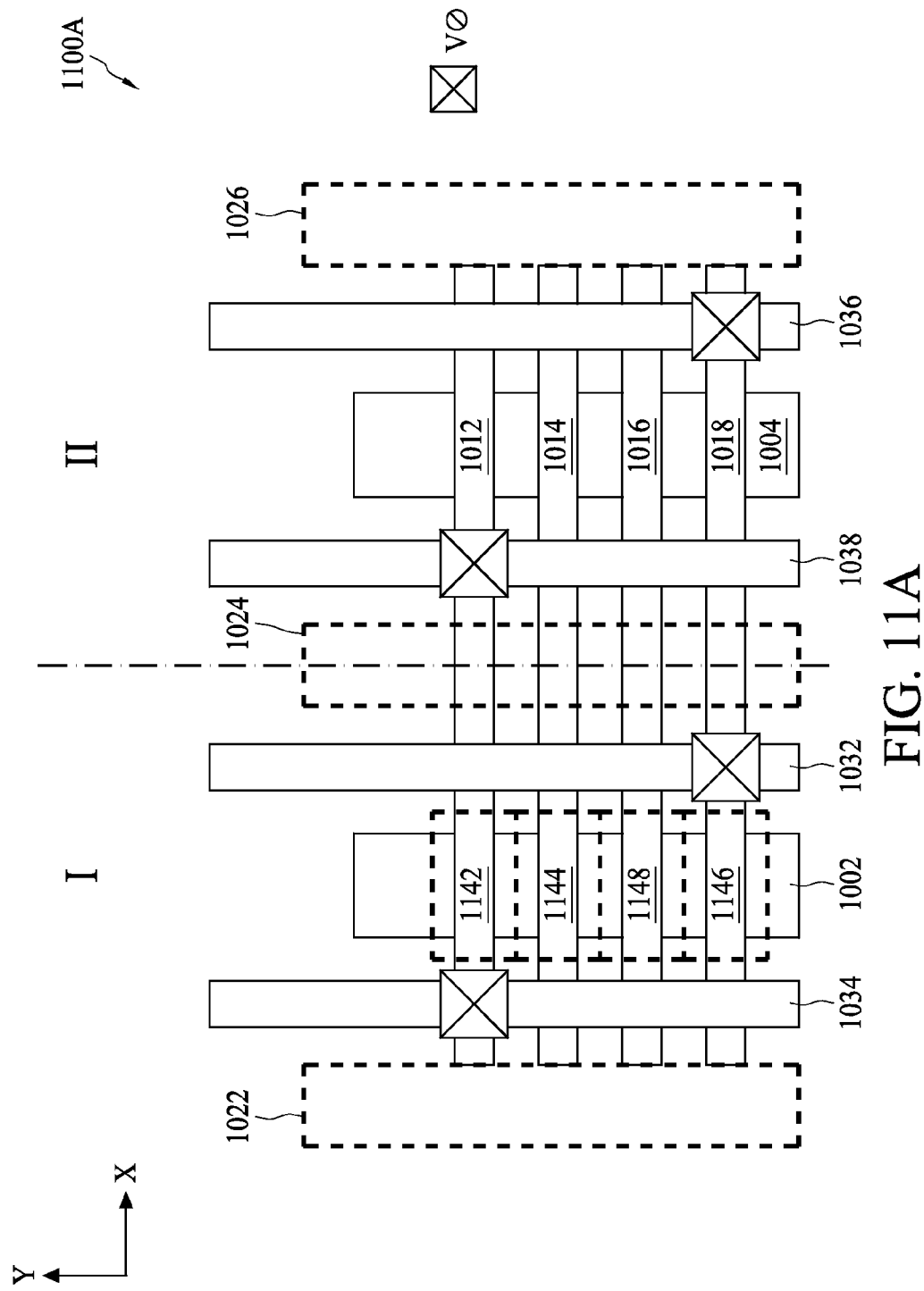
FIG. 11A is a layout diagram of a portion of an example layout design of a column driving circuit implemented based on the column driving circuit of FIG. 4 in accordance with some embodiments.

FIG. 11A is a layout diagram of a portion of an example layout design 1100A of a column driving circuit implemented based on the circuit in FIG. 4 in accordance with some embodiments. Components in FIG. 11A that are the same or similar to those in FIG. 10A are being given the same or similar reference numbers or labels, and detailed description thereof is thus omitted.

Compared with layout design 1000A, in region I of FIG. 11A, polysilicon layout pattern 1012 and active region layout pattern 1002 correspond to transistor 1142, which corresponds to transistor 432a in FIG. 4. Polysilicon layout pattern 1014 and active region layout pattern 1002 correspond to transistor 1144, which corresponds to transistor 432b. Polysilicon layout pattern 1018 and active region layout pattern 1002 correspond to transistor 1146, which corresponds to transistor 434a. Polysilicon layout pattern 1016 and active region layout pattern 1002 correspond to transistor 1148, which corresponds to transistor 434b. In some embodiments, each transistor of transistors 1042, 1044, 1046, and 1048 and an individual transistor of the memory cells in the resulting memory circuit have the same size.

In region II of FIG. 11A, various layout patterns are arranged in a manner similar to those in region I, and detailed description thereof is omitted.

Figure 11B:
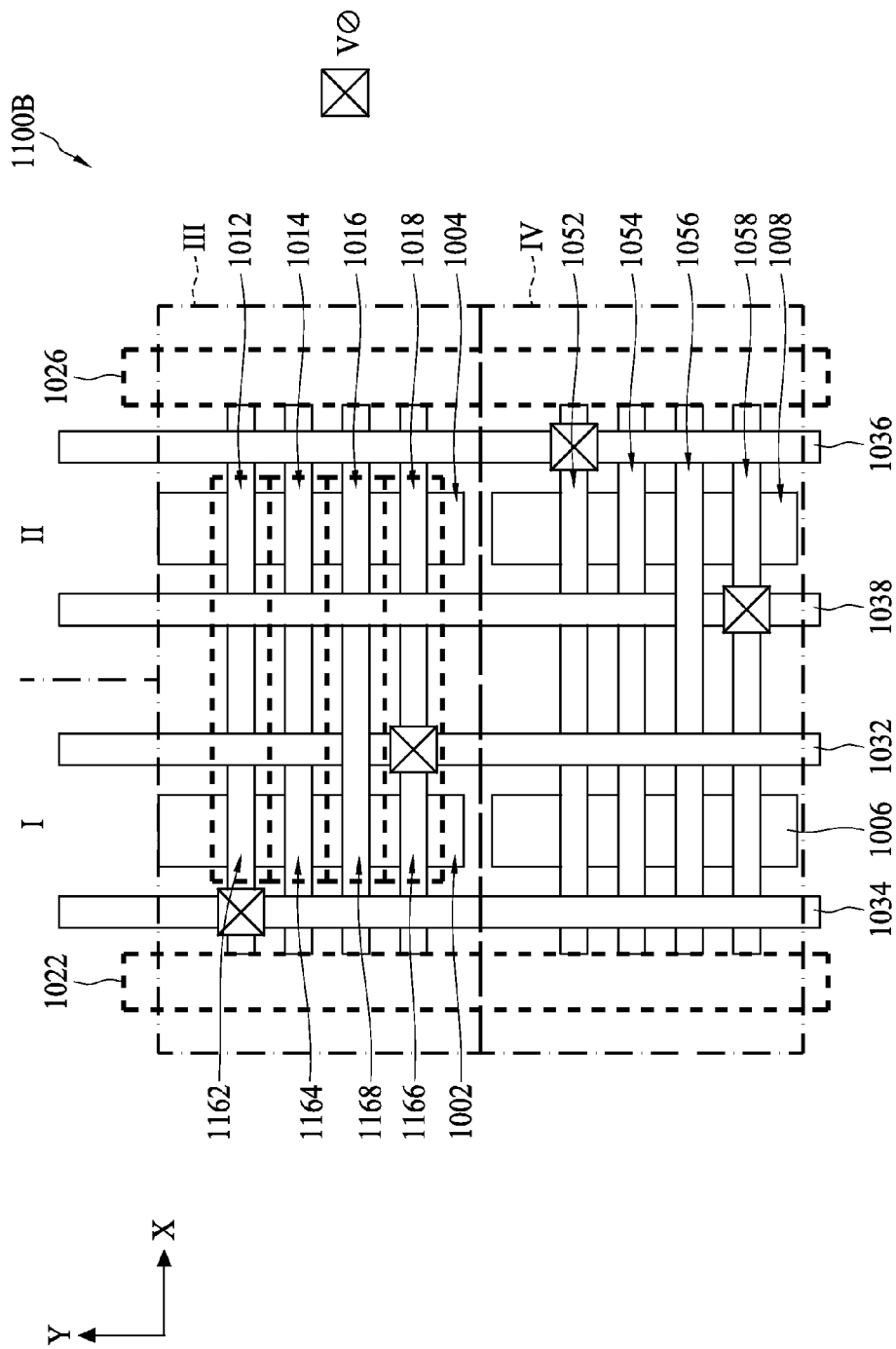
FIG. 11B is a layout diagram of a portion of another example layout design of a column driving circuit implemented based on the column driving circuit of FIG. 4 in accordance with some embodiments.

FIG. 11B is a layout diagram of a portion of another example layout design 1100B of a column driving circuit implemented based on the circuit in FIG. 4 in accordance with some embodiments. Components in FIG. 11B that are the same or similar to those in FIG. 10B are being given the same or similar reference numbers or labels, and detailed description thereof is thus omitted.

Compared with layout design 1000B, in region III of FIG. 11B, polysilicon layout pattern 1012 and active region layout patterns 1002 and 1004 correspond to transistor 1162, which corresponds to transistor 432a in FIG. 4. Polysilicon layout pattern 1014 and active region layout patterns 1002 and 1004 correspond to transistor 1164, which corresponds to transistor 432b. Polysilicon layout pattern 1018 and active region layout patterns 1002 and 1004 correspond to transistor 1166, which corresponds to transistor 434a. Polysilicon layout pattern 1016 and active region layout patterns 1002 and 1004 correspond to transistor 1168, which corresponds to transistor 434b. In some embodiments, each transistor of transistors 1162, 1164, 1166, and 1168 has an effective size twice that of an individual transistor of the memory cells in the resulting memory circuit.

In region IV of FIG. 10B, various layout patterns are arranged in a manner similar to those in region III, and detailed description thereof is omitted.

In accordance with one embodiment, a circuit includes a first data line, a second data line, a first pulling device, a second pulling device, a third pulling device, and a fourth pulling device. The first pulling device is between the first data line and a first voltage. The first pulling device is configured to be activated or deactivated responsive to a first control signal; and is configured to pull a first signal at the first data line toward a voltage level of the first voltage based on a second signal at the second data line when the first pulling device is activated. The second pulling device is between the second data line and the first voltage. The second pulling device is configured to be activated or deactivated responsive to a second control signal; and is configured to pull a second signal at the second data line toward the voltage level of the first voltage based on the first signal at the first data line when the second pulling device is activated. The third pulling device is between the first data line and a second voltage. The third pulling device is configured to pull the first signal at the first data line toward a voltage level of the second voltage based on the first control signal. The fourth pulling device is between the second data line and the second voltage. The fourth pulling device is configured to pull the second signal at the second data line toward the voltage level of the second voltage based on the second control signal.

In accordance with another embodiment, a circuit includes a first data line, a second data line, a first voltage node configured to carry a first voltage, a second voltage node configured to carry a second voltage, and a control circuit. The circuit also includes a first transistor and a second transistor coupled in series between the first voltage node and the first data line, and a third transistor and a fourth transistor coupled in series between the first voltage node and the second data line. A gate of the first transistor is coupled with the second data line, and a gate of the second transistor is coupled with the control circuit. A gate of the third transistor is coupled with the first data line, and a gate of the fourth transistor is coupled with the control circuit. The circuit also includes a fifth transistor coupled between the second voltage node and the first data line and a sixth transistor coupled between the second voltage node and the second data line. A gate of the fifth transistor is coupled with the control circuit. A gate of the sixth transistor is coupled with the control circuit.

In accordance with another embodiment, a method of driving a first data line and a second data line includes charging the first data line and the second data line to a predetermined voltage level. Responsive to a first write data signal, a second write data signal, and one or more of a write control signal or a column selection signal, a pulling device of a first pulling device or a second pulling device is activated, and the other pulling device of the first pulling device or the second pulling device is deactivated. The first pulling device is between the first data line and a first voltage node configured to carry a first voltage, and the second pulling device is between the second data line and the first voltage node. A signal at a data line of the first data line or the second data line that corresponds to the activated pulling device is pulled to a voltage level of the first voltage. A signal at the other data line of the first data line or the second data line that corresponds to the deactivated pulling device is pulled to a voltage level of a second voltage.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit, comprising:
    a first data line;
    a second data line;
    a first pulling device coupled to the first data line and a first voltage, the first pulling device being configured to:
        be activated or deactivated responsive to a first control signal; and
        pull a first signal at the first data line toward a voltage level of the first voltage based on a second signal at the second data line when the first pulling device is activated;
    a second pulling device coupled to the second data line and the first voltage, the second pulling device being configured to:
        be activated or deactivated responsive to a second control signal; and
        pull a second signal at the second data line toward the voltage level of the first voltage based on the first signal at the first data line when the second pulling device is activated;
    a third pulling device coupled to the first data line and a second voltage, the third pulling device being configured to pull the first signal at the first data line toward a voltage level of the second voltage based on the first control signal; and
    a fourth pulling device coupled to the second data line and the second voltage, the fourth pulling device being configured to pull the second signal at the second data line toward the voltage level of the second voltage based on the second control signal.

2. The circuit of claim 1, further comprising:
    a control circuit configured to
        generate the first control signal based on at least a write control signal and a first write data signal; and
        generate the second control signal based on at least the write control signal and a second write data signal.

3. The circuit of claim 2, wherein
    the control circuit is configured to generate the first control signal and the second control signal such that a first voltage swing of the first control signal or the second control signal differs from a second voltage swing from the voltage level of the first voltage to the voltage level of the second voltage.

4. The circuit of claim 2, wherein
    the control circuit is further configured to:
        generate the first control signal based on a column selection signal; and
        generate the second control signal based on the column selection signal.

5. The circuit of claim 2, wherein
    the control circuit comprises two NOR gates; or
    the control circuit comprises two NAND gates.

6. The circuit of claim 1, further comprising:
    a precharge circuit configured to charge the first data line and the second data line to a predetermined voltage level.

7. The circuit of claim 6, wherein the precharge circuit is configured to receive the first voltage and to use the voltage level of the first voltage as the predetermined voltage level.

8. The circuit of claim 1, wherein
    the voltage level of the first voltage is greater than the voltage level of the second voltage;
    the first pulling device comprises a first P-type transistor;
    the second pulling device comprises a second P-type transistor;
    the third pulling device comprises a first N-type transistor; and
    the fourth pulling device comprises a second N-type transistor.

9. The circuit of claim 1, wherein
    the voltage level of the first voltage is less than the voltage level of the second voltage;
    the first pulling device comprises a first N-type transistor;
    the second pulling device comprises a second N-type transistor;
    the third pulling device comprises a first P-type transistor; and
    the fourth pulling device comprises a second P-type transistor.

10. A circuit, comprising:
a first data line;
a second data line;
a first voltage node configured to carry a first voltage;
a second voltage node configured to carry a second voltage;
a control circuit;
a first transistor and a second transistor coupled in series between the first voltage node and the first data line;
a third transistor and a fourth transistor coupled in series between the first voltage node and the second data line;
a fifth transistor coupled between the second voltage node and the first data line, a gate of the fifth transistor being coupled with the control circuit; and
a sixth transistor coupled between the second voltage node and the second data line, a gate of the sixth transistor being coupled with the control circuit.

11. The circuit of claim 10, wherein
the first transistor and the third transistor are transistors of a first type; and
the fifth transistor and the sixth transistor are transistors of a second type different from the first type.

12. The circuit of claim 11, wherein
the second transistor and the fourth transistor are transistors of the first type.

13. The circuit of claim 11, wherein the circuit has one of the following conditions:
the first transistor and the third transistor are P-type transistors and the fifth transistor and the sixth transistor are N-type transistors; or
the first transistor and the third transistor are N-type transistors and the fifth transistor and the sixth transistor are P-type transistors.

14. The circuit of claim 10, wherein the circuit has one set of the following sets of conditions:
a first set of conditions including:
a source of the first transistor is coupled with the first voltage node;
a drain of the first transistor is coupled with the second transistor;
a source of the third transistor is coupled with the first voltage node; and
a drain of the third transistor is coupled with the fourth transistor; or
a second set of conditions including:
a source of the first transistor is coupled with the second transistor;
a drain of the first transistor is coupled with the first data line;
a source of the third transistor is coupled with the fourth transistor; and
a drain of the third transistor is coupled with the second data line.

15. The circuit of claim 10, wherein the control circuit comprises:
a first logic gate having an output coupled with the gate of the second transistor and the gate of the fifth transistor, the first logic gate being configured to receive a write control signal and a first write data signal;
a second logic gate having an output coupled with the gate of the second transistor and the gate of the fifth transistor, the second logic gate being configured to receive the write control signal and a second write data signal; and
the first logic gate and the second logic gate are both NOR gates or both NAND gates.

16. The circuit of claim 15, wherein
the control circuit is configured to generate the first control signal at the output of the first logic gate and a second control signal at the output of the second logic gate; and
the control circuit is configured such that a first voltage swing of the first control signal or the second control signal differs from a second voltage swing from a voltage level of the first voltage to a voltage level of the second voltage.

17. The circuit of claim 10, further comprising:
a precharge circuit configured to charge the first data line and the second data line to a voltage level of the first voltage.

18. A method of driving a first data line and a second data line, the method comprising:
charging the first data line and the second data line to a predetermined voltage level;
responsive to a first write data signal, a second write data signal, and one or more of a write control signal or a column selection signal,
activating a pulling device of a first pulling device or a second pulling device and deactivating the other pulling device of the first pulling device or the second pulling device, the first pulling device being between the first data line and a first voltage node configured to carry a first voltage, and the second pulling device being between the second data line and the first voltage node;
pulling a signal at a data line of the first data line or the second data line that corresponds to the activated pulling device to a voltage level of the first voltage; and
pulling a signal at the other data line of the first data line or the second data line that corresponds to the deactivated pulling device to a voltage level of a second voltage.

19. The method of claim 18, further comprising:
responsive to a reset signal, activating the first pulling device and the second pulling device.

20. The method of claim 18, wherein
a third pulling device is coupled with the first data line and a second voltage node configured to carry the second voltage;
a fourth pulling device is coupled with the second data line and the second voltage node; and
pulling the signal at the other data line that corresponds to the deactivated pulling device comprises activating a pulling device of the third pulling device or the fourth pulling device that corresponds to the other data line.

* * * * *